United States Patent [19]

Shin

[11] Patent Number: 6,136,701
[45] Date of Patent: *Oct. 24, 2000

[54] CONTACT STRUCTURE FOR SEMICONDUCTOR DEVICE AND THE MANUFACTURING METHOD THEREOF

[75] Inventor: Heon-jong Shin, Seoul, Rep. of Korea

[73] Assignee: Samsung Electronics Co., Ltd., Kyungki-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/001,541

[22] Filed: Dec. 31, 1997

Related U.S. Application Data

[62] Division of application No. 08/596,421, Feb. 2, 1996, Pat. No. 5,880,527, which is a continuation of application No. 08/305,476, Sep. 13, 1994, abandoned.

[30] Foreign Application Priority Data

Sep. 13, 1993 [KR] Rep. of Korea ...................... 93-18358

[51] Int. Cl.$^7$ ................................................. H01L 21/44
[52] U.S. Cl. ........................ 438/666; 438/244; 438/246; 438/248; 438/337; 438/359; 438/361; 438/391; 438/424; 438/430; 438/700
[58] Field of Search ................................ 438/244, 246, 438/248, 337, 359, 361, 391, 424, 430, 666, 700

[56] References Cited

U.S. PATENT DOCUMENTS

| | | | |
|---|---|---|---|
| 4,922,313 | 5/1990 | Tsuchiya | 357/23.6 |
| 4,933,739 | 6/1990 | Harari | 257/773 |
| 4,963,957 | 10/1990 | Ohi et al. | 357/34 |
| 4,980,747 | 12/1990 | Hutter et al. | 357/50 |
| 5,003,365 | 3/1991 | Havemann et al. | 357/34 |
| 5,077,228 | 12/1991 | Eklund et al. | 437/40 |

FOREIGN PATENT DOCUMENTS 3-006058  1/1991  Japan ...................................... 257/387

OTHER PUBLICATIONS

Silicon Processing for the VLSI Era, vol. 2, pp. 160–162.

*Primary Examiner*—Richard Booth
*Assistant Examiner*—David A. Zarneke
*Attorney, Agent, or Firm*—Pillsbury Madison & Sutro LLP

[57] ABSTRACT

A contact structure of a semiconductor device includes an impurity-doped region formed in the semiconductor substrate, a trench having a groove in the semiconductor substrate, with the groove being in contact with at least one side face of the impurity-doped region, a conductive layer buried in the trench, and a contact region formed on at least one side face of the impurity-doped region, for connecting the impurity-doped region and the conductive layer. Thus, the area occupied by a unit cell is reduced and integration density can be increased accordingly.

9 Claims, 5 Drawing Sheets

CONTACT STRUCTURE FOR SEMICONDUCTOR DEVICE AND THE MANUFACTURING METHOD THEREOF this is a divisional of Ser. No. 08/596,421, which is now U.S. Pat. No. 5,880,527, filed Feb. 2, 1996, which is a continuation of Ser. No. 08/305,476, filed Sep. 13, 1994, abandoned.

BACKGROUND OF THE INVENTION

The present invention relates to a contact structure for a semiconductor device, and more particularly to a contact structure having a side contact formed on the side face of an impurity-doped region, and to the manufacturing method thereof.

An integrated circuit is created by many circuit patterns on a single-crystal semiconductor substrate. The semiconductor substrate is defined into active regions and isolation regions, both electrically and structurally, by a local oxidation of silicon (LOCOS) method or a trench method. Here, interconnection technology is used to connect isolated devices. To connect the isolated devices, a material having high conductivity and thin-film properties, e.g., polysilicon or aluminum, is used.

Meanwhile, a contact for the interconnection is formed as follows. First, an oxide film is formed on a semiconductor substrate by a conventional method such as thermal oxidation. Next, the oxide film is patterned to form an oxide film pattern having an opening. Then, a conductive material is deposited over the entire surface of the semiconductor substrate having the opening. Thus, a contact region is formed on the opening by the deposited conductive material, and the substrate and conductive material are then interconnected. Such an interconnection can be classified as a semiconductor substrate-to-metal contact (made of, for example, aluminum) or a semiconductor substrate-to-polysilicon contact.

The above interconnection technology is disclosed in *Silicon Processing for the VLSI Era* (Vol. 2, p160–162), which describes a buried contact structure and a butting contact structure as means for interconnection. FIG. 1 is a cross-sectional view showing the disclosed buried contact structure.

Referring to FIG. 1, a buried contact structure is comprised of a semiconductor substrate 1, a first oxide layer 2 for defining a contact region 6, a trench isolation region 3 for isolating an active region, a first conductive layer 4 for connecting with an impurity-doped region 5, a second conductive layer 4a closely spaced with respect to the first conductive layer 4. Here, when the first conductive layer 4, e.g., a polysilicon layer, and the impurity-doped region 5 are connected in the buried contact structure, the first conductive layer is directly connected to the impurity-doped region, which thus forms contact region 6.

Also, a cross-sectional view of the above disclosed butting contact structure is shown in FIG. 2. Here, a butting contact structure is comprised of a semiconductor substrate 1, a first oxide layer 2 for defining a contact region 6, a trench isolation region 3 for isolating an active region, a first conductive layer 4 for connecting an impurity-doped region 5 formed on the semiconductor substrate 1, a second oxide layer 7 formed on the first conductive layer 4, a second conductive layer 8 for connecting the first conductive layer 4 (e.g., a polysilicon layer) and the impurity-doped region 15, and a third conductive layer 8a closely spaced with respect to the second conductive layer 8. Here, when the first conductive layer 4 and the impurity-doped region 5 are connected in the butting contact structure, first conductive layer 4 is connected to impurity-doped region 5 through second conductive layer 8, e.g., an aluminum or polysilicon layer, and thus forms contact region 6.

However, the buried contact structure and the butting contact structure as described above have certain problems. Foremost among these is the difficulty in reducing the size of each isolated device so as to further integrate a circuit formed by these devices. Accordingly, the width and area of the isolation region formed between devices and the length of the interconnection of a contact structure must all be reduced.

In FIGS. 1 and 2, the first conductive layer 4 of FIG. 1 and the second conductive layer 8 of FIG. 2 are formed on and connected to the impurity-doped region 5 in a planar manner, such that a sufficient length "b" is always present.

Also, as shown in FIG. 1, the first conductive layer 4 must have a predetermined length or region, in order to connect the impurity-doped region 5. Accordingly, when second conductive layer 4a is closely spaced with respect to the first conductive layer 4, a sufficient length "a" is also needed to isolate devices. Likewise, when the third conductive layer 8a is closely spaced with respect to the second conductive layer 8, as shown in FIG. 2, length "a" is needed to isolated devices.

As described above, when the conductive layer, i.e., layers 4 and 4a of FIG. 1 and layers 8 and 8a of FIG. 2, are connected to the impurity-doped region 5 in a planar manner, lengths "a" and "b" are inevitable. Thus, it is difficult to reduce the unit cell area of a semiconductor device.

SUMMARY OF THE INVENTION

Therefore, an object of the present invention is to provide a contact structure of a semiconductor device, wherein the area per unit cell is reduced.

Another object of the present invention is to provide a method for manufacturing the semiconductor device having the above contact structure.

To accomplish the fist object, the present invention provides a contact structure of a semiconductor device, comprising an impurity-doped region formed in a semiconductor substrate; a trench having a groove in the semiconductor substrate, the groove being in contact with at least one side face of the impurity-doped region; a conductive layer buried in the groove; and a contact region formed on at least one side face of the impurity-doped region, to thereby connect the impurity-doped region and the conductive layer.

The conductive layer can be comprised of a polysilicon layer. Preferably, the thickness of the conductive layer is of 1000~3000 A. Also, the conductive layer may include dopant atoms.

The depth and width of the trench are 0.8~1.0 mm and 0.4 mm, respectively. Also, the depth and width of the groove are 0.4 mm and 0.2 mm, respectively.

To accomplish the second object, the present invention provides a method for manufacturing a contact structure of a semiconductor device, comprising the steps of sequentially forming a first oxide layer pattern and an isolation mask layer pattern on a semiconductor substrate; forming a trench in the semiconductor substrate; filling the trench with an insulating layer; removing the first oxide layer pattern and the isolation mask layer pattern; forming a second oxide layer over the entire surface of the semiconductor substrate;

etching a portion of the insulating layer and the second oxide layer, thereby forming a trench having a groove; forming a conductive layer pattern formed on the second oxide layer and the insulating layer and thus filling inside the groove; and forming an impurity-doped region connected to the conductive layer pattern inside the groove through a contact region.

The depth and width of the trench are formed to be 0.8~1.0 mm and 0.4 mm, respectively. Also, the depth and width of the groove are formed to be 0.4 mm and 0.2 mm, respectively.

The conductive layer pattern is comprised of polysilicon and preferably, formed of a thickness of 1000~3000 A. Also, the conductive layer pattern may include dopant atoms.

Further, the present invention provides a method for manufacturing a contact structure of a semiconductor device, comprising the steps of sequentially forming a first oxide layer pattern and an isolation mask layer pattern on a semiconductor substrate; forming a trench in the semiconductor substrate; filling the trench with an insulating layer; removing the first oxide layer pattern and the isolation mask layer pattern; forming a second oxide layer and a first conductive layer over the entire surface of the semiconductor substrate; etching a portion of the first conductive layer, the insulating layer and the second oxide layer, thereby forming a trench having a groove; forming a second conductive layer on the first conductive layer and thus filling inside the groove; forming conductive layer pattern by etching the first and second conductive layers; and forming an impurity-doped region connected to the conductive layer pattern inside the groove through a contact region.

According to the present invention, the layout area of a semiconductor device per unit cell is reduced by decreasing a space between conductive layer patterns and the width of the impurity-doped region. As a result, the semiconductor device of the present invention leads to improved integration density and increased freedom in designing the metallization layout.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention will be described, hereinafter, in more detail, with reference to the accompanying drawings.

Specially, the main feature of the present invention is that a contact region is formed using a side face of an impurity-doped region, and thus the expression "side contact" is often used.

Figure 1:
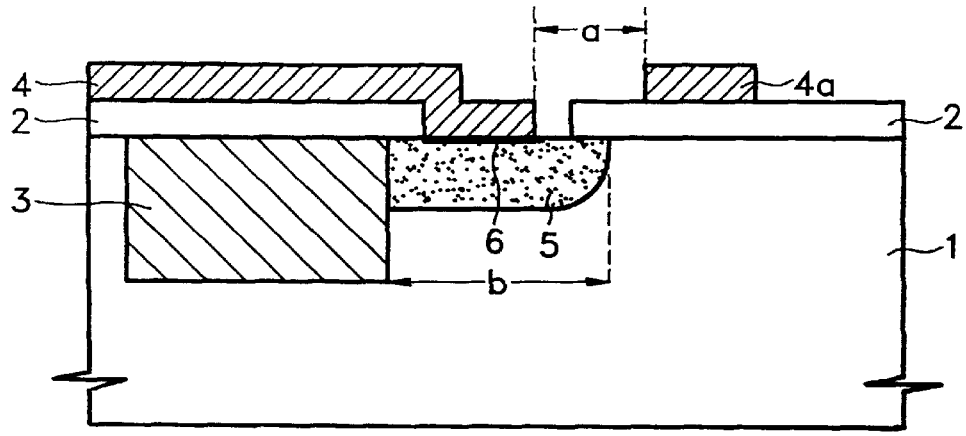
FIG. 1 is a cross-sectional view for explaining an example of a conventional buried contact structure.
Figure 2:
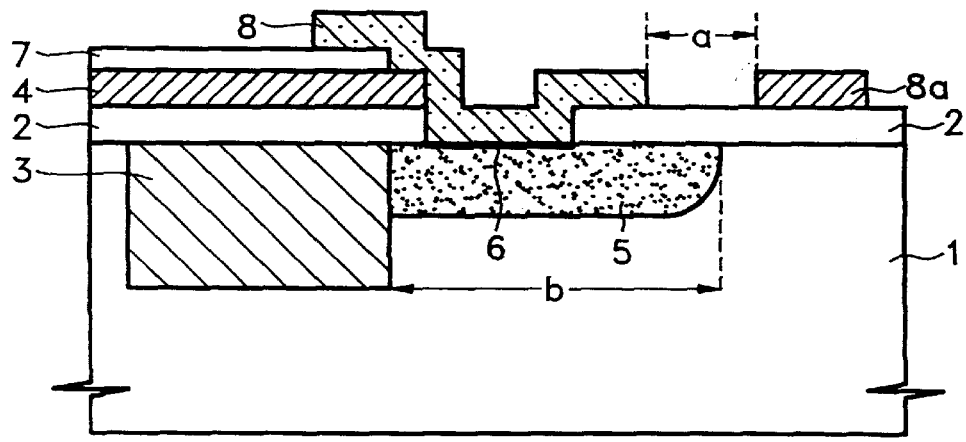
FIG. 2 is a cross-sectional view for explaining an example of a conventional butting contact structure.
Figure 3:
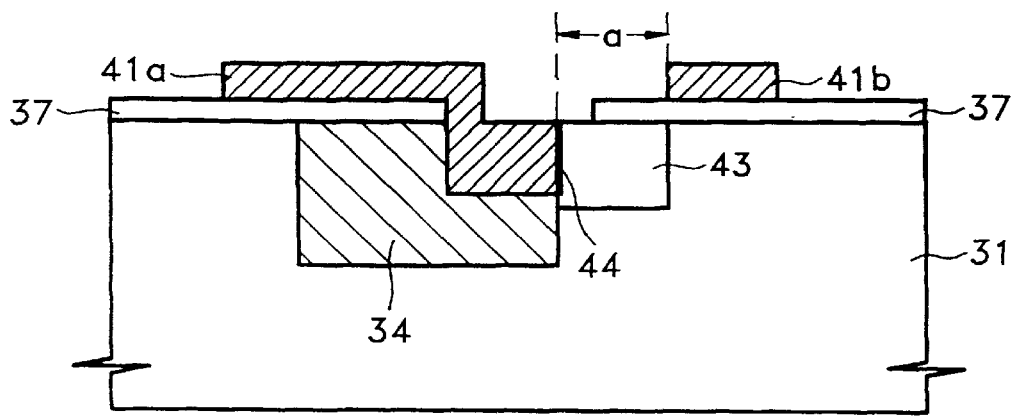
FIG. 3 is a cross-sectional view for showing a side contact according to the present invention.

FIG. 3 is a cross-sectional view for showing a side contact structure according to the present invention.

Referring to FIG. 3, a trench isolation region 34 (trench) for isolating an active region and an impurity-doped region 43 are formed in a semiconductor substrate 31. Also, an oxide layer 37 as a predetermined pattern is formed on the semiconductor substrate 31 for the purpose of insulation, and a first conductive layer 41a and a second conductive layer 41b, i.e., conductive layer patterns, are formed on the oxide layer 37. A portion of the trench isolation region 34 is etched to form a groove inside the trench isolation region 34 and the first conductive layer 41a is filled into the groove, to thereby connect to the impurity-doped region 43. A contact region 44 is formed on a portion of the bordering region between the first conductive layer 41a and the impurity-doped region 43.

Especially, the present invention describes a contact portion on a side face of the impurity-doped region 43, and that the first conductive layer 41a is connected to this side face. Therefore, an interconnection using the side face of the impurity-doped region 43 can reduce a spacing between the first conductive layer 41a and the second conductive layer 41b. Also, the width of the impurity-doped region can be reduced using the side contact of the impurity-doped region 43. As a result, an area per unit cell of semiconductor device can be reduced.

Hereinafter, the manufacturing method of the present invention for forming a side contact structure is explained in more detail with the following embodiment.

FIGS. 4A to 4F are cross-sectional views for showing a manufacturing method according to the first embodiment of the present invention.

Figure 4A:
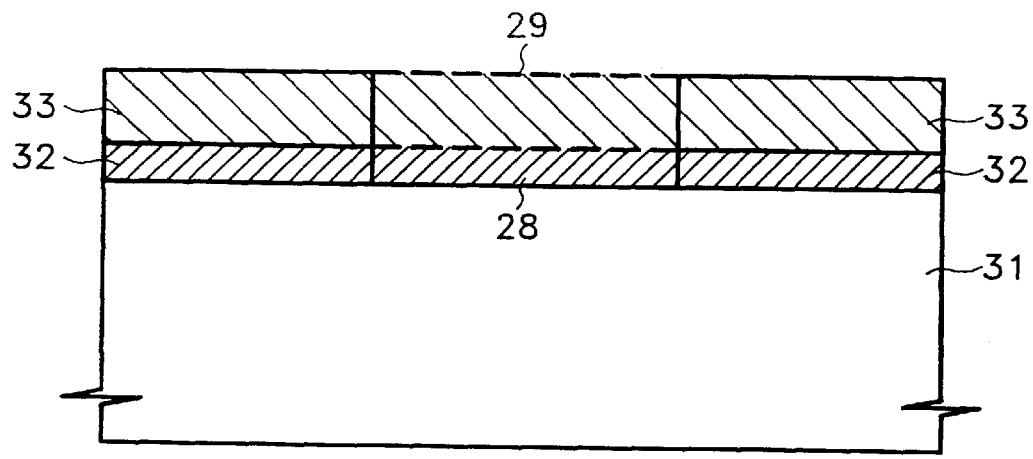
FIGS. 4A to 4F are cross-sectional views for showing a manufacturing method according to the first embodiment of the present invention.

FIG. 4A shows a step of forming a first oxide layer pattern and an isolation mask layer pattern. A first oxide layer 28 and an isolation mask layer 29 are sequentially formed on a semiconductor substrate 31. Here, the first oxide layer 28 is formed to a thickness of 200~500 A by a thermal oxidation or other conventional method. The isolation mask layer 29, e.g., a silicon nitride layer, is formed to a thickness of 900~1500 A by a low-pressure chemical vapor deposition (LPCVD) method. Next, the first oxide layer 28 and the isolation mask layer 29 are patterned by a conventional method to define an active region, so that a first oxide layer pattern 32 and an isolation mask layer pattern 33 are formed.

Figure 4B:
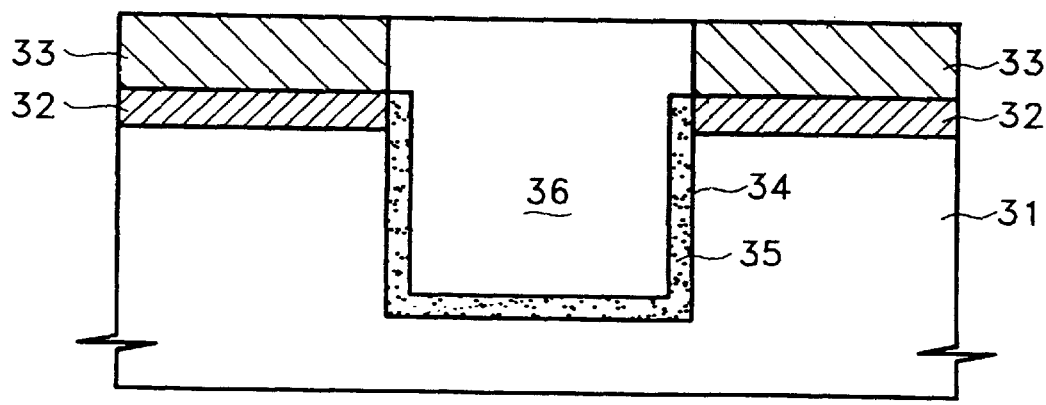

FIG. 4B shows a step of forming and filling a trench. A trench or trench isolation region 34 is formed by dry etching a semiconductor substrate 31 using the first oxide layer pattern 32 and the isolation mask layer pattern 33 as an etching mask. The trench 34 is controlled to a depth of 0.8~1.0 mm and a width of about 0.4 mm. After a first insulating layer 35 is formed so as to relieve the stress due to the dry etching of a semiconductor device, the trench 34 is filled using a second insulating layer 36. The first insulating layer 35, e.g., an oxide layer, is formed to a thickness of 100–300 A by a thermal method. The second insulating layer 35 is formed using a borophospho-silicate glass (BPSG) or tetra-ethyl-othosilicate (TEOS) by a CVD method.

Figure 4C:
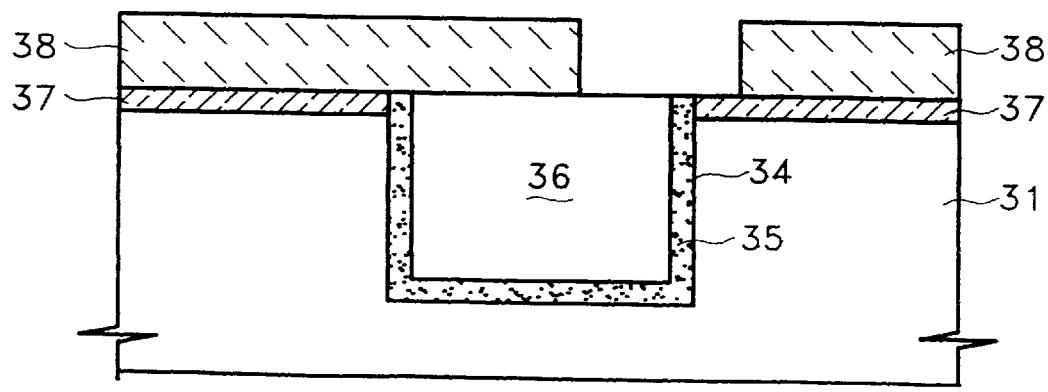

FIG. 4C shows a step of forming a second oxide layer and a photoresist pattern. First, a portion of the second insulating layer 36 formed inside the trench 34 is etched by an etch-back process using an etching end point detection, so as to prevent over-etching the second insulating layer 36. Next, the isolation mask layer pattern 33 and the first oxide layer pattern 32 are removed, and then a second oxide layer 37 is formed to a thickness of 150~300 A over the entire surface of the semiconductor substrate 31. The second oxide layer 37 is used as a gate oxide layer. After a photoresist is deposited on the second insulating layer 36 and the second oxide layer 37, the photoresist is patterned to form a photoresist pattern 38. The photoresist pattern 38 is used as an etching mask when the second insulating layer 36, the first insulating layer 35 of the trench isolation region 34 and the second oxide layer 37 is sequentially etched.

Figure 4D:
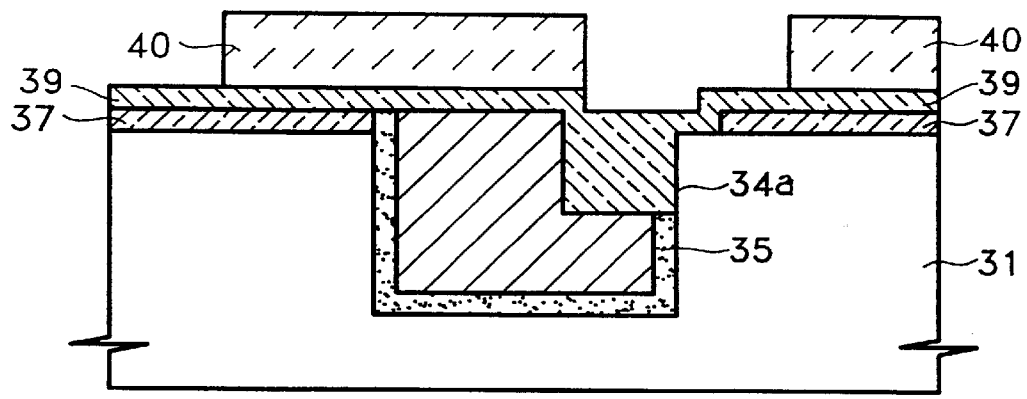

FIG. 4D shows a step of forming a groove 34a in the trench 34 and filling the groove 34a with a conductive material. In more detail, the second oxide layer 37 and a portion of the second insulating layer 36 and first insulating layer 35 inside the trench 34 are etched using the photoresist pattern 38 as an etching mask. The etched width and depth of the first and second insulating layers 35 and 36 inside the trench 34 are controlled to about 0.2 mm and 0.4 mm, respectively. Thus, a trench having a groove 34a inside the trench 34 is formed. Especially, the etched region formed inside the trench 34 becomes a portion of a contact region with an impurity-doped region by a subsequent process. Then, the photoresist pattern 38 is removed. Next, a conductive material is deposited to form a conductive layer 39 over the entire surface of the resultant material thus filling the groove 34a which connects with the impurity-doped region by a subsequent process. The conductive layer 39, e.g., a polysilicon layer, is deposited to a thickness of 1000~3000 A by LPCVD and is used as a gate electrode. The conductive layer 39 may include dopant atoms by an impurity doping process. Then, a photoresist is deposited and patterned to form a photoresist pattern 40, so as to etch the conductive layer 39.

Figure 4E:
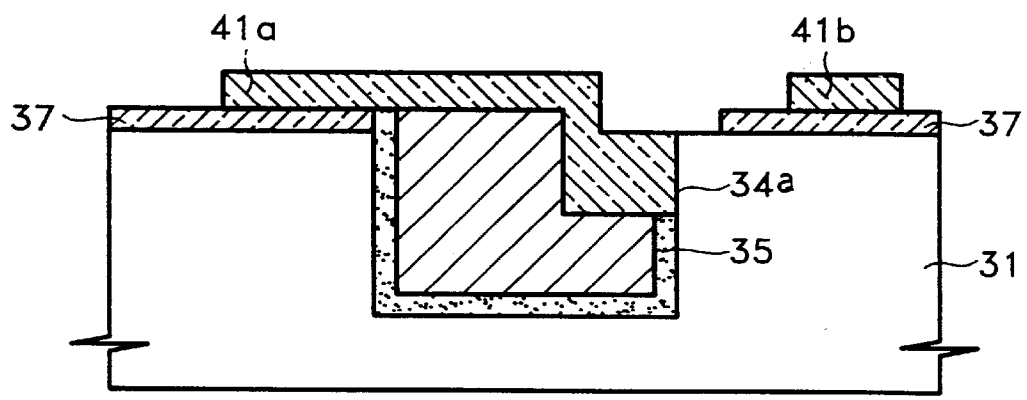

FIG. 4E shows a step of forming conductive layer patterns by etching the conductive layer. A first conductive layer pattern 41a and a second conductive layer pattern 41b, i.e., conductive layer patterns, are formed by etching the conductive layer 39 using the photoresist pattern 40 as an etching mask.

Figure 4F:
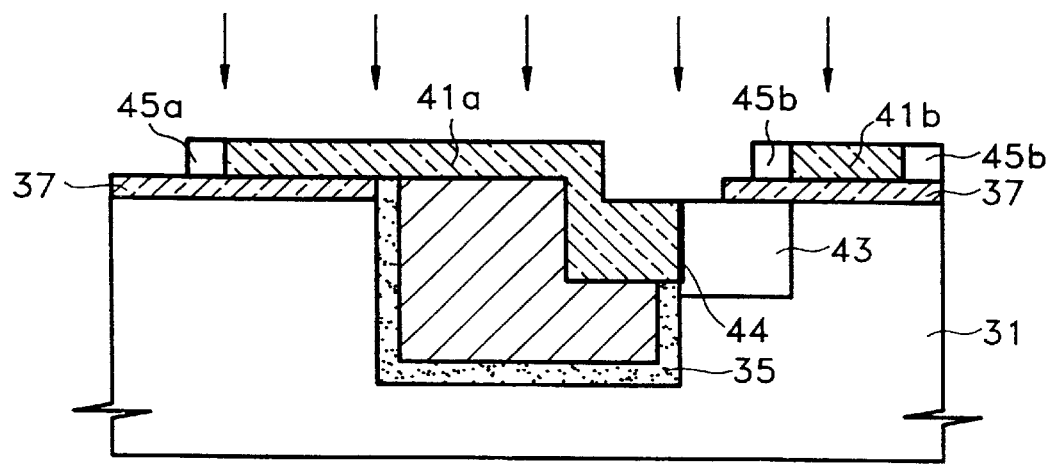

FIG. 4F shows a step of implanting an impurity using the conductive layer patterns 41a and 41b as an implantation mask. The impurity-doped region 43 is formed by implanting a P-type or N-type impurity using the conductive layer patterns 41a and 41b as an implantation mask. The impurity-doped region 43 is thereby connected to the side face of trench isolation region 34. Thus, the first conductive layer pattern 41a formed inside the trench 34 and being connected to the impurity-doped region 43 thus forms contact region 44. Here, the conductive layer pattern 41a or 41b can be used as a gate electrode, and spacer layer 45a and 45b can be further formed on the sidewalls of the conductive layer patterns 41a and 41b.

FIGS. 5A to 5F are cross-sectional views for showing a manufacturing method according to the second embodiment of the present invention.

Figure 5A:
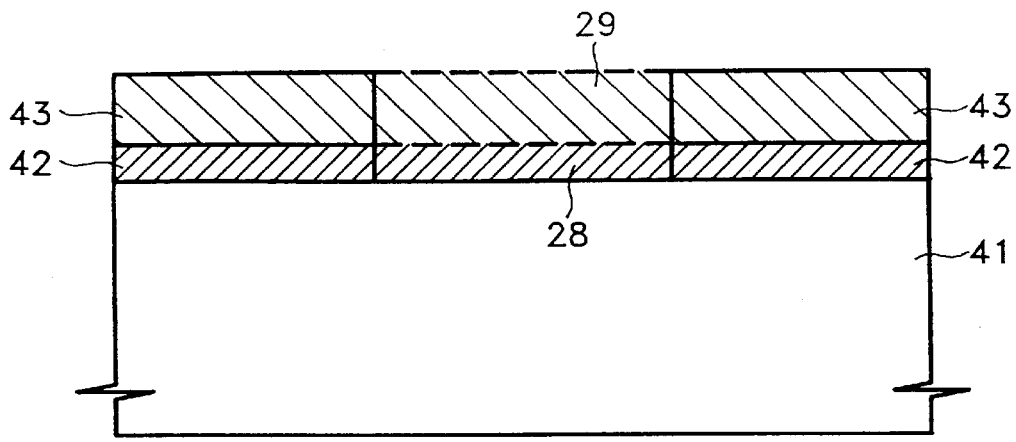
FIGS. 5A to 5F are cross-sectional views for showing a manufacturing method according to the second embodiment of the present invention.

FIG. 5A shows a step of forming a first oxide layer pattern and an isolation mask layer pattern. A first oxide layer 28 and an isolation mask layer 29 are sequentially formed on a semiconductor substrate 41. Here, the first oxide layer 28 is formed to a thickness of 200~500 A by a thermal oxidation or other conventional method. The isolation mask layer 29, e.g., a silicon nitride layer, is formed to a thickness of 900~1500 A by an LPCVD method. Next, the first oxide layer 28 and the isolation mask layer 29 are patterned by a conventional method to define an active region, so that a first oxide layer pattern 42 and an isolation mask layer pattern 43 are formed.

Figure 5B:
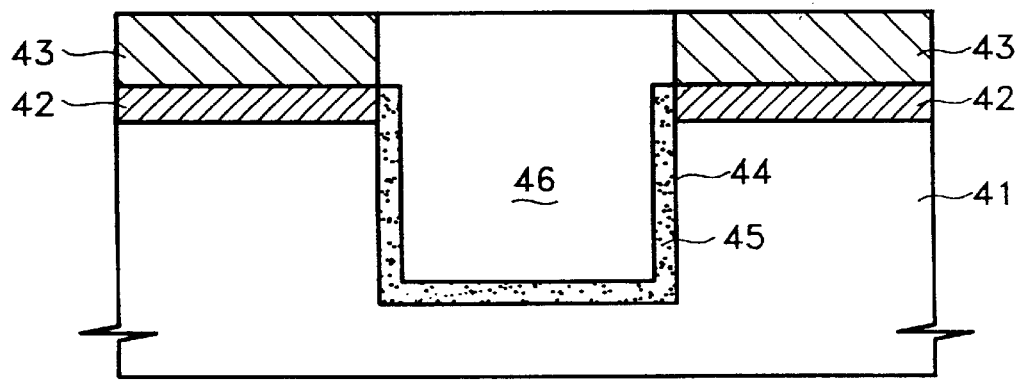

FIG. 5B shows a step of forming and filling a trench. A trench 44 is formed by dry etching a semiconductor substrate 41 using the first oxide layer pattern 42 and the isolation mask layer pattern 43 as an etching mask. The trench 44 is controlled to a depth of 0.8~1.0 mm and a width of about 0.4 mm. After a first insulating layer 45 is formed so as to relieve a stress due to the dry etching of a semiconductor device, the trench 44 is filled using a second insulating layer 46. The first insulating layer 45, e.g., an oxide layer is formed to a thickness of 100–300 A by a thermal method. The second insulating layer 45 is formed of BPSG or TEOS by a CVD method.

Figure 5C:
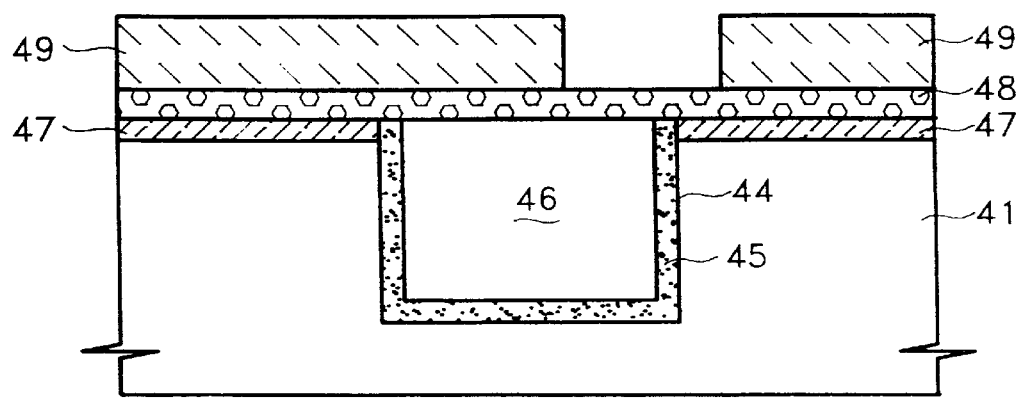

FIG. 5C shows a step of forming a second oxide layer, a first conductive layer and a photoresist pattern. A portion of the second insulating layer 46 formed in the trench 44 is etched by an etch-back process using an etching end point detection, so as to prevent over-etching the second insulating layer 46. Next, the isolation mask layer pattern 43 and the first oxide layer pattern 42 are removed, and immediately thereafter a second oxide layer 47 and a first conductive layer 48 are sequentially formed via a "no-time-delay" process over the entire surface of the semiconductor substrate 41, so as to prevent damage to the second oxide layer 47. The second oxide layer 47 is formed to a thickness of 150~300 A by the thermal oxidation method. Also, the first conductive layer 48, e.g., a polysilicon layer, is formed to a thickness of 500~1000 A by LPCVD. Especially, the first conductive layer 48 is formed to be thinner than that of a second conductive layer formed by a subsequent process. Then, a photoresist is deposited and patterned to form a photoresist pattern 49, so as to etch the first conductive layer 48, the second oxide layer 47 and a portion of the first and second insulating oxide layers (45 and 46) formed inside the trench 44.

Figure 5D:
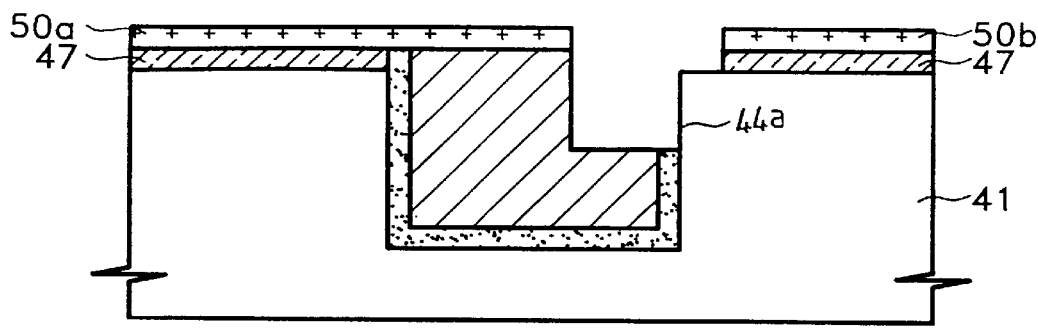

FIG. 5D shows a step of forming a groove 44a in a trench isolation region. In more detail, the first conductive layer 48, the second oxide layer 47 and a portion of the second insulating layer 46 and first insulating layer 45 formed inside the trench isolation region 44 are etched using the photoresist pattern 49 as an etching mask. The etched width and depth of the first and second insulating layers 45 and 46 inside trench isolation region 44 are controlled to about 0.2 mm and 0.4 mm, respectively. Thus, a trench having a groove 44a inside the trench 44 is formed, and first conductive layer patterns 50a and 50b are formed. Then, the photoresist pattern 49 is removed. Especially, the etched region inside the trench 44 becomes a contact region with an impurity-doped region which is formed by a subsequent process.

Figure 5E:
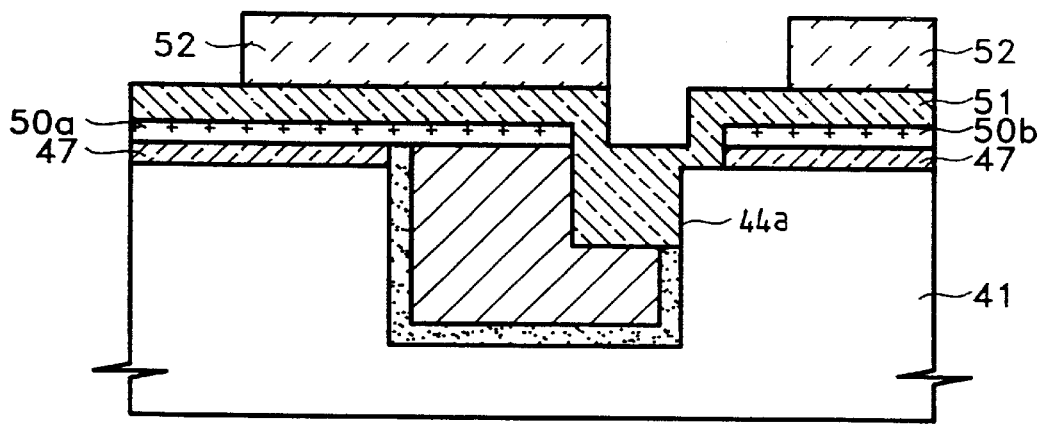

FIG. 5E shows a step of forming a second conductive layer and a photoresist pattern. A second conductive layer 51 is formed over the entire surface of resultant material, thus filling the groove which is connected to the impurity-doped region formed by a subsequent process. The second conductive layer 51, e.g., a polysilicon layer, is deposited to a thickness of 1000~3000 A by LPCVD. Then, a photoresist is deposited and patterned to form a photoresist pattern 52, so as to etch the second conductive layer 51.

Figure 5F:
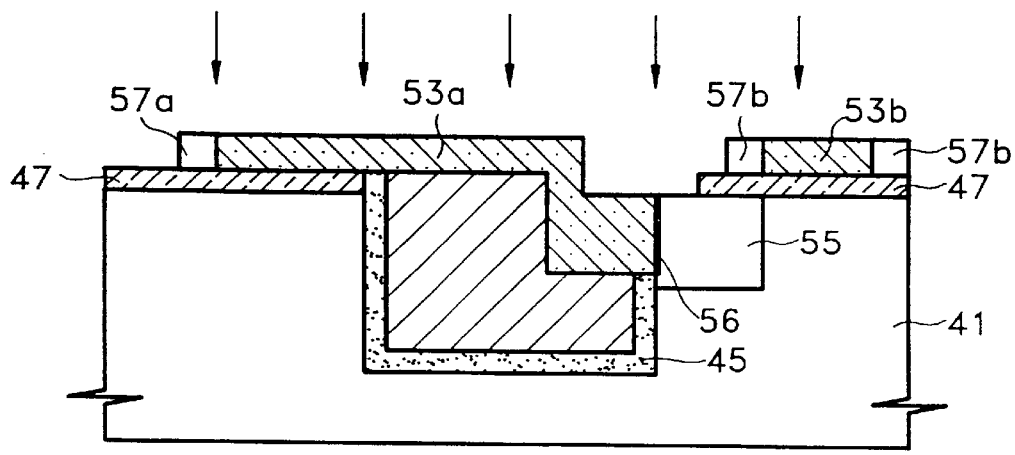

FIG. 5F shows a step of forming conductive layer patterns by patterning the first and second conductive layers. Conductive layer patterns 53a and 53b are formed by etching the first and second conductive layers 51, 50a and 50b using the photoresist pattern 52 as an etching mask. Then, an impurity-doped region 55 is formed by implanting P-type or N-type impurity using the conductive layer patterns 53a and 53b as an implantation mask. The impurity-doped region 55 is connected to the side face of trench isolation region 44. Thus, the second conductive layer formed inside the trench 44 is connected to the impurity-doped region 55 and thereby forms a contact region 56. The conductive layer pattern 53a or 53b can be used as a gate electrode and may include dopant atoms by an impurity doping process. Especially, a spacer layer 57a and 57b can be further formed on the sidewall of the conductive layer patterns 53a and 53b.

Though the present invention illustrates a buried contact structure by example, the present invention can be similarly applied to a butting contact structure. Also, while the present invention states that the first and second conductive layers are formed of polysilicon, other materials can be used adaptively in other fields.

According to the present invention, the layout area of a semiconductor device per unit cell is reduced using the side contact structure. For example, in a 4 Mb SRAM layout, the present invention reduces the layout by 7%, that is, from 10.26 $mm^2$ to 9.54 $mm^2$.

In brief, the interconnection of the present invention is formed on a side face of the impurity-doped region, thereby reducing the space required between conductive layer patterns and the width of the impurity-doped region itself. As a result, the area occupied by a unit cell is reduced, thereby improving integration density and increasing the freedom in designing the metallization layout.

While the present invention has been particularly shown and described with reference to particular embodiment thereof, it will be understood by those skilled in the art that various changes in form and details may be effected therein without departing from the spirit and scope of invention as defined by the appended means.

What is claimed is:

1. A method for manufacturing a contact structure of a semiconductor device, comprising the steps of:

sequentially forming a first oxide layer pattern and an isolation mask layer pattern on a semiconductor substrate;

forming a trench in the semiconductor substrate, said trench having a vertical depth of 0.8–1.0 μm in a first direction substantially perpendicular to a principle surface of said semiconductor substrate and having a horizontal width of 0.4 μm in a second direction substantially parallel to said principle surface of said semiconductor substrate;

filling said trench with an insulating layer;

removing said first oxide layer pattern and said isolation mask layer pattern;

forming a second oxide layer over the entire surface of said semiconductor substrate;

etching a portion of said insulating layer and said second oxide layer, thereby forming a trench having a groove;

forming a conductive layer pattern on said second oxide layer and said insulating layer and thus filling inside the groove; and forming an impurity-doped region connected to a side portion of said conductive layer pattern inside the groove through a side contact region formed on at least one side face of said impurity doped region.

2. A method for manufacturing a contact structure of a semiconductor device as claimed in claim 1 wherein the depth and width of said groove are formed to be 0.4 mm and 0.2 mm, respectively.

3. A method for manufacturing a contact structure of a semiconductor device as claimed in claim 1 wherein said conductive layer pattern is formed to a thickness of 1000~3000 A.

4. A method for manufacturing a contact structure of a semiconductor device as claimed in claim 1 wherein said conductive layer pattern is comprised of polysilicon.

5. A method for manufacturing a contact structure of a semiconductor device as claimed in claim 1 wherein said conductive layer pattern includes dopant atoms.

6. A method for manufacturing a contact structure of a semiconductor device, comprising the steps of:

sequentially forming a first oxide layer pattern and an isolation mask layer pattern on a semiconductor substrate;

forming a trench in the semiconductor substrate, said trench having a vertical depth of 0.8–1.0 μm in a first direction substantially perpendicular to a principle surface of said semiconductor substrate and having a horizontal width of 0.4 μm in a second direction substantially parallel to said principle surface of said semiconductor substrate;

filling said trench with an insulating layer;

removing said first oxide layer pattern and said isolation mask layer pattern;

forming a second oxide layer and a first conductive layer over the entire surface of said semiconductor substrate;

etching a portion of said first conductive layer, said insulating layer and said second oxide layer, thereby forming a trench having a groove;

forming a second conductive layer on said first conductive layer and thus filling inside the groove;

forming conductive layer pattern by etching said first and second conductive layers; and forming an impurity-doped region connected to a side portion of said conductive layer pattern inside the groove through a side contact region formed on at least one side face of said impurity doped region.

7. A method for manufacturing a contact structure of a semiconductor device as claimed in claim 6 wherein said second oxide layer and said first conductive layer is formed via a no-time-delay process.

8. A method for manufacturing a contact structure of a semiconductor device as claimed in claim 6 wherein said first conductive layer is formed to a thickness of 500~1000 A.

9. A method for manufacturing a contact structure of a semiconductor device as claimed in claim 6 wherein said second conductive layer is formed to a thickness of 1000~3000 A.

* * * * *